US011387790B2

(12) United States Patent
Cope et al.

(10) Patent No.: US 11,387,790 B2
(45) Date of Patent: Jul. 12, 2022

(54) POWER SEMICONDUCTOR DEVICE WITH CHARGE TRAPPING COMPENSATION

(71) Applicant: Analog Devices International Unlimited Company, Limerick (IE)

(72) Inventors: Mark Cope, Bath (GB); Patrick Joseph Pratt, Mallow (IE)

(73) Assignee: Analog Devices International Unlimited Company, Limerick (IE)

( * ) Notice: Subject to any disclaimer, the term of this patent is extended or adjusted under 35 U.S.C. 154(b) by 226 days.

(21) Appl. No.: 16/742,677

(22) Filed: Jan. 14, 2020

(65) Prior Publication Data
US 2020/0244232 A1 Jul. 30, 2020

Related U.S. Application Data

(60) Provisional application No. 62/796,483, filed on Jan. 24, 2019.

(51) Int. Cl.
H03F 3/19 (2006.01)
H01L 21/28 (2006.01)
H03G 3/30 (2006.01)

(52) U.S. Cl.
CPC .......... *H03F 3/19* (2013.01); *H01L 29/40117* (2019.08); *H03G 3/3047* (2013.01)

(58) Field of Classification Search
CPC .... H03F 3/19; H01L 29/40117; H03G 3/3047
(Continued)

(56) References Cited

U.S. PATENT DOCUMENTS 5,680,418 A   10/1997   Croft et al.
6,781,361 B2   8/2004   Nestler
(Continued)

FOREIGN PATENT DOCUMENTS

EP   2 311 271 B1   9/2014
EP   2 858 321 B1   8/2018
EP   3 166 223 B1   9/2020

OTHER PUBLICATIONS

Jardel et al. "An Electro thermal Model for AlGaN/GaN Power HEMTs Including Trapping Effects to Improve Large-Signal Simulation Results on High VSWR", IEEE transactions on Microwave theory and Techniques vol. 55, No. 12, Dec. 2007, pp. 2660-2669. (Year: 2007).*

(Continued)

Primary Examiner — Hafizur Rahman
(74) Attorney, Agent, or Firm — Knobbe, Martens, Olson & Bear, LLP

(57) ABSTRACT

The disclosed technology relates generally to semiconductor devices, and more particularly to power semiconductor devices in which effects of charge trapping are compensated. A radio frequency (RF) power transmitter system comprises a RF power semiconductor device that outputs a time-varying gain characteristic from a RF signal input waveform originating from a digital input, wherein the time-varying gain characteristic includes a gain error associated with charge-trapping events having a memory effect on the RF power semiconductor device lasting longer than 1 microsecond. The RF power transmitter system further comprises circuitry configured to apply an analog gate bias waveform to the RF power semiconductor device based on the time-varying gain characteristic to reduce the gain error.

20 Claims, 12 Drawing Sheets

(58) Field of Classification Search
USPC .......................................................... 330/295
See application file for complete search history.

(56) References Cited

U.S. PATENT DOCUMENTS

| | | | |
|---|---|---|---|
| 6,828,858 | B2 | 12/2004 | Larson et al. |
| 7,099,367 | B2 | 8/2006 | Richards et al. |
| 7,149,257 | B2 | 12/2006 | Braithwaite |
| 7,330,517 | B2 | 2/2008 | Taler et al. |
| 7,542,518 | B2 | 6/2009 | Kim et al. |
| 7,577,211 | B2 | 8/2009 | Braithwaite |
| 7,773,692 | B2 | 8/2010 | Copeland et al. |
| 7,848,451 | B2 | 12/2010 | Cai et al. |
| 8,019,007 | B2 | 9/2011 | Boppana et al. |
| 8,023,587 | B2 | 9/2011 | Deng et al. |
| 8,040,182 | B2 | 10/2011 | Horiguchi et al. |
| 8,224,259 | B2 | 7/2012 | Behrens et al. |
| 8,248,042 | B2 | 8/2012 | Morita |
| 8,798,559 | B2 | 8/2014 | Kilambi et al. |
| 8,854,421 | B2 | 10/2014 | Kasahara |
| 9,129,586 | B2 | 9/2015 | Bajic et al. |
| 9,306,506 | B1 | 4/2016 | Zhang et al. |
| 9,356,592 | B2 | 5/2016 | Hwang et al. |
| 9,369,121 | B2 | 6/2016 | Jeon et al. |
| 9,374,044 | B2 | 6/2016 | Jian et al. |
| 9,585,607 | B2 | 3/2017 | Kamath et al. |
| 9,705,477 | B2 | 7/2017 | Velazquez |
| 9,735,741 | B2 | 8/2017 | Pratt et al. |
| 9,787,459 | B2 | 10/2017 | Azadet |
| 9,866,269 | B1 | 1/2018 | Zhao et al. |
| 10,050,659 | B2 | 8/2018 | Choi et al. |
| 10,324,169 | B2 | 6/2019 | Tua |
| 10,447,211 | B2 | 10/2019 | Rollins et al. |
| 10,498,372 | B2 | 12/2019 | Pratt |
| 10,715,702 | B1 | 7/2020 | Zhao et al. |
| 2002/0178133 | A1 | 11/2002 | Zhao et al. |
| 2003/0232612 | A1 | 12/2003 | Richards et al. |
| 2005/0157814 | A1 | 7/2005 | Cova et al. |
| 2011/0204975 | A1* | 8/2011 | Miyashita ............. H03F 1/3258 330/149 |
| 2011/0255628 | A1 | 10/2011 | Woleben et al. |
| 2013/0200948 | A1 | 8/2013 | Lee et al. |
| 2013/0329832 | A1 | 12/2013 | Morita et al. |
| 2014/0072075 | A1 | 3/2014 | Cai et al. |
| 2014/0269988 | A1 | 9/2014 | Schafferer et al. |
| 2016/0190993 | A1* | 6/2016 | Nobbe .................... H03F 3/211 330/296 |
| 2018/0331662 | A1* | 11/2018 | Maa ...................... H03F 1/3258 |
| 2019/0356345 | A1 | 11/2019 | Ota et al. |
| 2020/0244232 | A1 | 7/2020 | Cope et al. |
| 2020/0259465 | A1 | 8/2020 | Wu et al. |
| 2020/0389194 | A1 | 12/2020 | Luo et al. |
| 2021/0067097 | A1* | 3/2021 | Wang ................... H02M 3/1584 |

OTHER PUBLICATIONS

Gomes et al., "An Accurate Characterization of Capture Time Constants in GaN HEMTs", IEEE transactions on Microwave theory and Techniques vol. 67, No. 7, Jul. 2019, pp. 2465-2474 (Year: 2019).*

Barradas et al. "Compensation of long-term memory effects on GaN HEMT-based power amplifiers", IEEE Trans. Microwave Theory Techniques, vol. 65, No. 9, pp. 3379-3388, Sep. 2017 (Year: 2017).*

Tome' et al., "A Multiple-Time-Scale Analog Circuit for the Compensation of Long-Term Memory Effects in GaN HEMT-Based Power Amplifiers", IEEE Transactions On Microwave Theory and Techniques, vol. 68 Issue: 9, Sep. 2020, pp. 3709-3723. (Year: 2020).*

Amin et al., "Digital Predistortion of Single and Concurrent Dual-Band Radio Frequency GaN Amplifiers With Strong Nonlinear Memory Effects", IEEE Transactions on Microwave Theory and Techniques, vol. 65, No. 7, Jul. 2017, pp. 2453-2464.

Zhu et al., "RF Power Amplifier Behavioral Modeling Using Volterra Expansion with Laguerre Functions", © 2005 IEEE, pp. 963-966.

Mobile Radio Communications and 5G Networks, Nikhil Marriwala, C. C. Tripathi, Dinesh Kumar, Shruti Jain 2020.

Barradas et al., "Compensation of Long-Term Memory Effects on GaN HEMT-Based Power Amplifiers", IEEE Transactions on Microwave Theory and Techniques, pp. 1-10, Mar. 2017.

Ghannouchi et al., "Distortion and impairments mitigation and compensation of single- and multiband wireless transmitters (invited)", IET Microw. Antennas Propag., vol. 7, No. 7, pp. 518-534, 2013.

"ADRV9026 Quad-Channel, Wideband RF Transceiver Platform: 200 MHz Bandwidth Integrated Radio Transceiver Solution". Analog Devices, Inc. www.analog.com, 2019 in 4 pages.

Binari et al., "Trapping Effects in GaN and SiC Microwave FETs". Proceedings of the IEEE, vol. 90, No. 6. (2002), pp. 1048-1058.

Bisi, "Characterization of Charge Trapping Phenomena in GaN-based HEMTs". Università Degli Studi Di Padova, Information Science and Technology. Jan. 28, 2015 in 119 pages.

Chen et al., "The Trap Locations of GaN HEMT by Current Transient Spectroscopy". Global Communication Semiconductors, LLC (GCS). 2017 in 4 pages.

Joh et al., "A Current-Transient Methodology for Trap Analysis for GaN High Election Mobility Transistors". IEEE Transactions on Electron Devices, vol. 58, No. 1. (2010), pp. 132-140.

Medrel et al., "A 10W S-band class-B GaN amplifier with a dynamic gate bias circuit for linearity enhancement", International Journal of Microwave and Wireless Technologies, vol. 6, No. 1, Feb. 2014, pp. 3-11.

Uren et al., "Buffer design to minimize current collapse in GaN/AlGaN HFETs". IEEE Transactions on Electron Devices, vol. 59, No. 12. (2012), pp. 3327-3333.

Yuk et al., "An improved empirical large-signal model for high-power GaN HEMTs including self-heating and charge-trapping effects". IEEE MTT-S International Microwave Symposium Digest, https://ieeexplore.ieee.org/abstract/document/5165806, 2009 in pages.

* cited by examiner

POWER SEMICONDUCTOR DEVICE WITH CHARGE TRAPPING COMPENSATION

INCORPORATION BY REFERENCE

This application claims the benefit of priority of U.S. Provisional Application No. 62/796,483, filed Jan. 24, 2019, the content of which is hereby incorporated by reference in its entirety.

BACKGROUND

Field

The disclosed technology relates generally to semiconductor devices, and more particularly to power semiconductor devices in which effects of charge trapping are compensated.

Description of the Related Art

Radio frequency (RF) devices such as power amplifiers are widely used in many applications including wireless communication technologies. Various types of RF devices exist, including silicon (Si)-based devices, gallium arsenide (GaAs)-based devices, indium phosphide (InP)-based devices, silicon carbide (SiC)-based devices and gallium nitride (GaN)-based devices. A particular type of RF device may be selected over others for an application based on different advantages offered by the different types of RF devices, e.g., cost, performance and frequency of operation. For example, while Si-based devices generally provide lower fabrication cost, some Si-based devices are inferior compared to their compound semiconductor counterparts. Various types of RF devices include a transistor, such as a field effect transistor, which can display various transient non-ideal device characteristics. For example, the transistor may trap charge therewithin during operation, which may temporarily change the device characteristics, such as effective threshold voltage and/or drain current. There is a need for hardware and/or software solutions to compensate for the transient non-ideal behaviors, e.g., those resulting from charge trapping within a transistor included in RF devices.

SUMMARY

In one aspect, a radio frequency (RF) power transmitter system comprises a RF power semiconductor device which outputs a time-varying gain characteristic from a RF input signal waveform originating from a digital input, wherein the time-varying gain characteristic includes a gain error associated with a charge-trapping event having a memory effect on the RF power semiconductor device lasting longer than 1 microsecond. The RF power transmitter system further comprises circuitry configured to apply an analog gate bias waveform to the RF power semiconductor device based on the time-varying gain characteristic to reduce the gain error.

In another aspect, a radio frequency (RF) power transmitter device comprises a RF power semiconductor device configured to receive as an input a RF signal waveform originating from a digital input, and to receive as a further input an analog gate bias waveform adapted to compensate for gain error associated with charge-trapping events having a memory effect lasting longer than 1 microsecond on the RF power semiconductor device. The analog gate bias waveform is generated from a time-varying gain characteristic outputted by the RF power semiconductor device.

In yet another aspect, a method of compensating for charge-trapping effects in a radio frequency (RF) power semiconductor device comprises applying an RF input signal waveform, originating from a digital input, to a RF power semiconductor device and measuring a time-varying gain characteristic therefrom, wherein the time-varying gain characteristic includes a gain error associated with charge-trapping events having a memory effect on the RF power semiconductor device lasting longer than 1 microsecond. The method additionally comprises applying an analog gate bias waveform to the RF power semiconductor device based on the measured time-varying gain characteristic to reduce the RF gain error.

DETAILED DESCRIPTION

As described above, RF semiconductor devices such as RF power semiconductor devices can be based on a variety of different semiconductor material systems. For example, some RF power semiconductor devices are based on silicon technology, e.g., Si-based laterally diffused metal oxide semiconductor (LDMOS) devices, which may provide a cost advantage over other types of RF power semiconductor devices. For some applications, e.g., applications where relatively higher frequency (e.g., exceeding 4 GHz), relatively higher power (e.g., exceeding 100 W) and/or relatively higher power efficiency is/are desired, compound semiconductor-based RF power semiconductor devices, e.g., gallium nitride (GaN)-based RF power devices, may be employed as higher performance alternatives. GaN-based RF power devices can have certain advantages over other technologies including Si-based technologies in some applications, e.g., in process architectures where drain modulation is applied. The advantages may include improvements in efficiency and frequency range (e.g., higher fT), among other advantages.

While the need for high performance RF power semiconductor devices based on compound semiconductors such as GaN has been steadily rising, their implementation has been limited to relatively low volume applications such as military/aerospace. The limited implementation has been due in part due to fabrication costs, which are currently significantly higher than Si-based technologies.

In addition to cost considerations, a need for certain technological improvements has also been recognized for RF power semiconductor devices based on compound semiconductors. One such improvement is associated with reducing charge trapping and/or mitigating the effects of charge trapping that have been observed in RF power semiconductor devices based on compound semiconductors. A variety of detrimental effects of charge trapping has been observed, including transconductance frequency dispersion, current collapse of the direct current drain characteristics, gate- and drain-lag transients and restricted microwave power output, to name a few.

Figure 1:
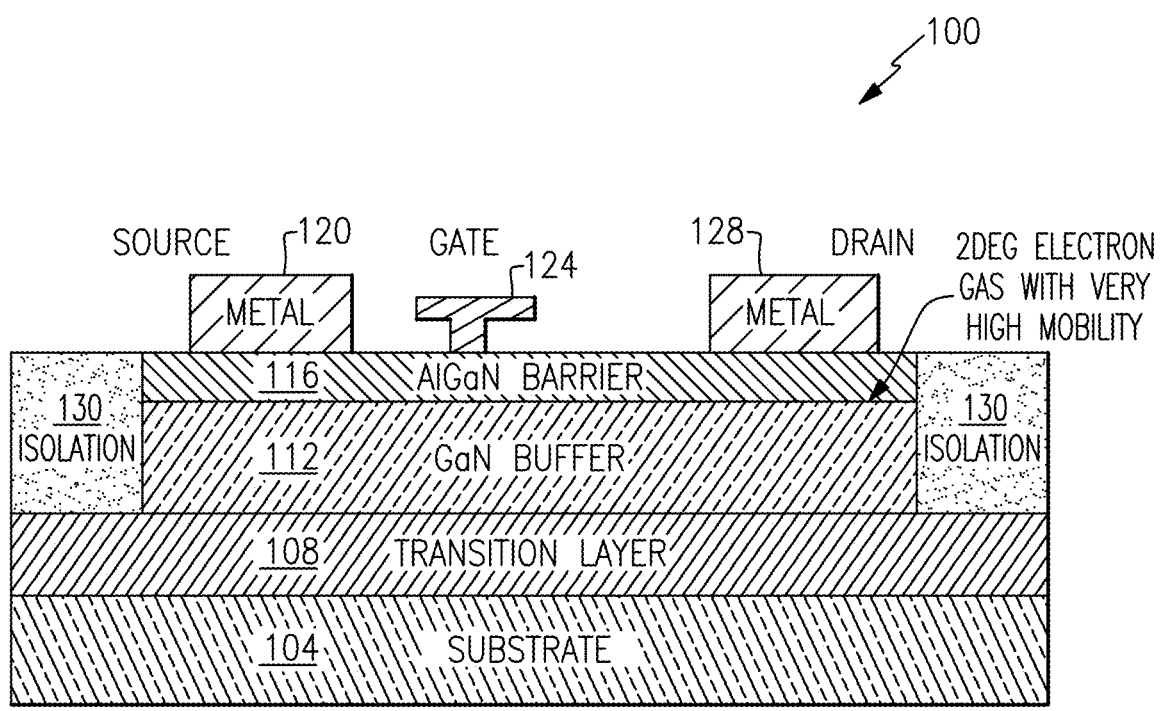
FIG. 1 is a cross-sectional view of an example RF power semiconductor device.

As described above, RF power semiconductor devices can include a variety of field-effect transistors (FETs), including Si-based laterally diffused metal oxide semiconductor (LDMOS), SiC-based metal-semiconductor field-effect transistors (MESFETs) and GaN-based high electron mobility transistors (HEMTs). As an illustrative example FIG. 1 is a cross-sectional view of a GaN-based HEMT 100 in which charge trapping effects can occur. The HEMT 100 includes a substrate 104 on which a transition layer 108, followed by a GaN buffer layer 112 and a barrier layer 116. A source 120, a gate 124 and a drain 128 are formed on the barrier layer. Isolation 130 may define lateral ends of the GaN buffer layer 112 and the barrier layer 116.

The substrate 104 may include Si, SiC, sapphire and/or GaN. The GaN buffer layer 112 may be, e.g., an un-doped GaN. The GaN buffer layer may be capped by an un-doped capped layer 116 comprising, e.g., an AlGaN barrier layer. The source 120 and the drain 128 can be formed of a suitable material for forming a substantially Ohmic contact with the barrier layer 116, and the gate 124 is formed of a suitable metal for forming a substantially Schottky contact. In operation, a two-dimensional electron gas (2DEG) forms a conducting channel in the buffer layer 112 near the interface between the buffer layer 112 and barrier layer 116.

Without being bound to any theory, charge trapping centers that the methods according to embodiments can compensate the effects of can reside at one or more of the surface of the barrier layer 116, the bulk of the barrier layer 116, at the interface between the barrier layer 116 and the GaN buffer layer 112, and/or in the bulk of the GaN buffer layer 112. Without being bound to any theory, the charge trapping centers can be physically associated with crystalline defects and/or impurities. Crystalline defects in compound semiconductors including GaN that can serve as charge trapping centers include, e.g., trapping centers can include, e.g., (metal or nitrogen) vacancies, antisites, interstitials and dislocations. For example, GaN buffer layer 112 can have relatively high density (e.g., $>10^8$ cm$^{-2}$) of dislocations. Impurities in compound semiconductors including GaN that can serve as charge trapping centers include, e.g., silicon (Si), oxygen (O), hydrogen (H), carbon (C), iron (Fe) and fluorine (F), to name a few.

Without being bound to any theory, charge trapping centers can energetically be disposed within a band gap of the GaN buffer layer 112 or the barrier layer 116. The charge trapping centers can be relatively shallow, e.g., within about 0.1 eV within a conduction band edge or a valence band edge, or be relatively deep, e.g., deeper than about 0.1 eV from the conduction band edge or the valence band edge.

A charge trapping event includes a charge capturing event by a charge trapping center and a charge detrapping event by the charge trapping center. The charge trapping and detrapping events can be characterized by various parameters including an activation energy, concentration of charge trapping centers and characteristic time constants. Without being bound to any theory, charge trapping and detrapping kinetics can be expressed respectively by Eq. [1] and Eq. [2] below:

$$N_{Filled}(t) = N_{TOT}[1 - \exp(-t/t_{cn})] \qquad \text{Eq. [1]}$$

$$N_{Filled}(t) = N_{TOT} \exp(-t/t_{en}) \qquad \text{Eq. [2]}$$

In Eqs. [1] and [2], $N_{TOT}$ can represent a concentration of charge trapping centers, $N_{Filled}$ (t) can represent a time dependent concentration of filled charge trapping canters, $t_{cn}$ can represent a trapping time constant and $t_{en}$ can represent a detrapping time constant. When the durations of charge trapping and/or detrapping events, or $t_{cn}$ and/or $t_{en}$, are relatively long, the memory effects arising therefrom on the RF power semiconductor device can correspondingly last a relatively long time.

The difficulty associated with compensating for the memory effects associated with charge trapping and/or detrapping events can be associated with the durations of the trapping and/or detrapping events. The inventors have discovered that, when durations of events that transiently affect the FET device characteristics, including effects of trapping and/or detrapping events, are relatively short, e.g., microseconds or less, the resulting memory effects on the device characteristics can be mitigated relatively effectively using existing digital compensation techniques such as digital predistortion techniques (DPDs). On the other hand, when the trapping and/or detrapping events are relatively long, e.g., tens microseconds or longer, such digital compensation techniques may be relatively ineffective.

Figure 2:
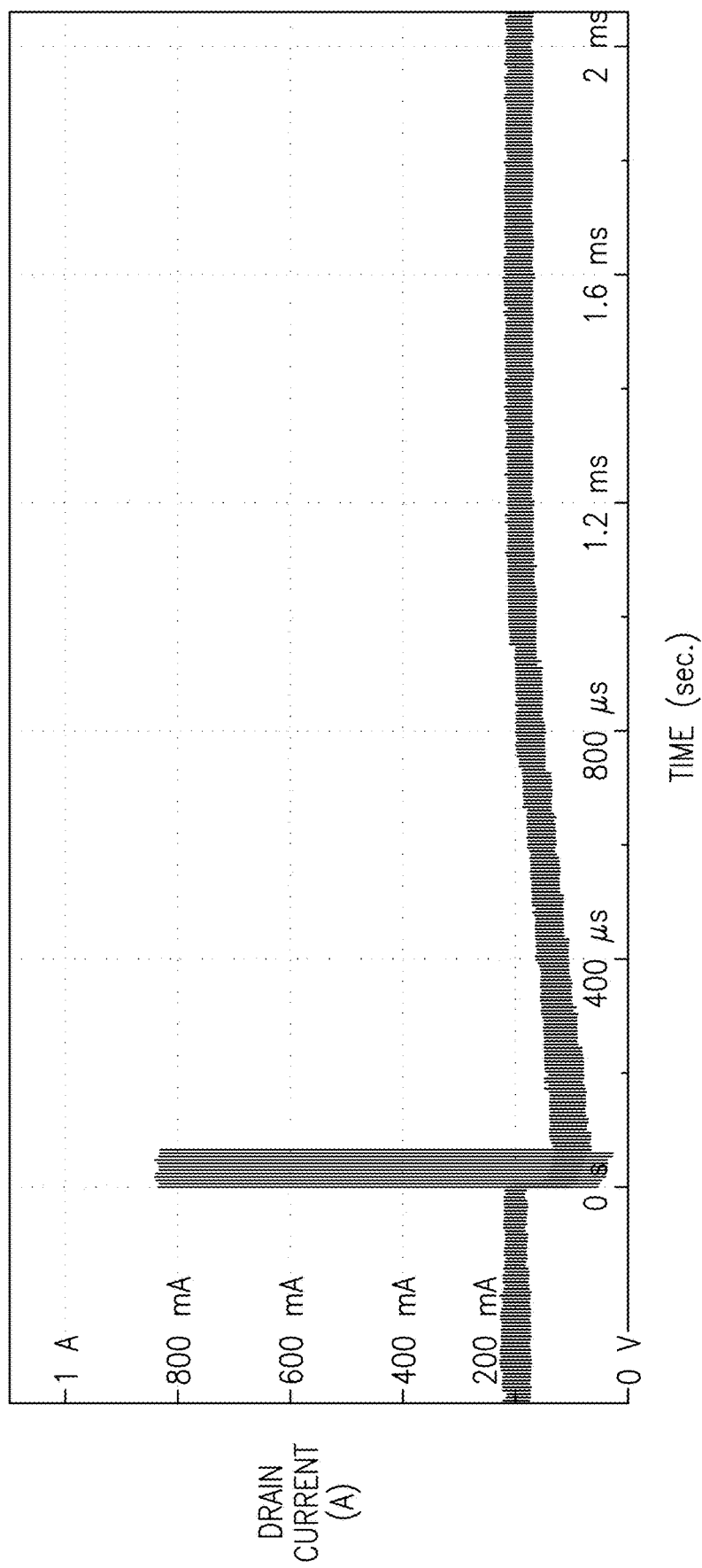
FIG. 2 is an experimental drain current as a function of time measured from transistor RF power semiconductor device.

As described above, a variety of detrimental effects of charge trapping has been observed, including transconductance frequency dispersion, current collapse of the direct current drain characteristics, gate- and drain-lag transients, and restricted microwave power output, to name a few. By way of example, FIG. 2 is an experimental drain current as a function of time measured on a GaN HEMT device. In particular, FIG. 2 illustrates a measured example effect of trapping and/or detrapping events in which the drain current has been observed to collapse after applying a pulse to the gate of the GaN HEMT device to induce charge trapping and/or detrapping. The measured GaN transistor was Cree CGH40010 (10 W) GaN HEMT transistor. The x and y axes plot time and measured drain current, respectively. The drain current before applying the pulse at time zero was set at about 200 mA. After the application of the pulse at time zero, it can be observed that a time duration lasting as long as a millisecond elapses before the drain current value returns to its prior undisturbed value. Such effects of charge trapping and/or detrapping can also results a corresponding variation in a gain of RF power amplifiers comprising such RF power semiconductor devices over this time period. This impact can be detrimental in many RF applications which rely on linearity of the gain of RF power amplifiers. For example, in wireless infrastructure systems incorporating long term evolution (LTE) waveforms, this may be evident when they are tested for error vector magnitude (EVM) using a test model waveform known as E-TM2 (or E-TM2a). The effects of charge trapping such as those shown in FIG. 2 can depend on a relatively long-term history of the input signal, and the adverse effects on an amplifier gain and/or phase transfer characteristics can last microseconds or more, e.g., milliseconds to even seconds. In part due to the slow variation in amplifier characteristics caused by charge trapping and/or detrapping, existing digital predistortion (DPD) techniques have not been sufficient to linearize the amplifier gain in response to charge trapping events. Thus, there is a need to mitigate or compensate for the charge-trapping effects in GaN-based power devices, and various embodiments disclosed herein aim to address these and other shortcomings of existing compensation techniques.

Figure 3:
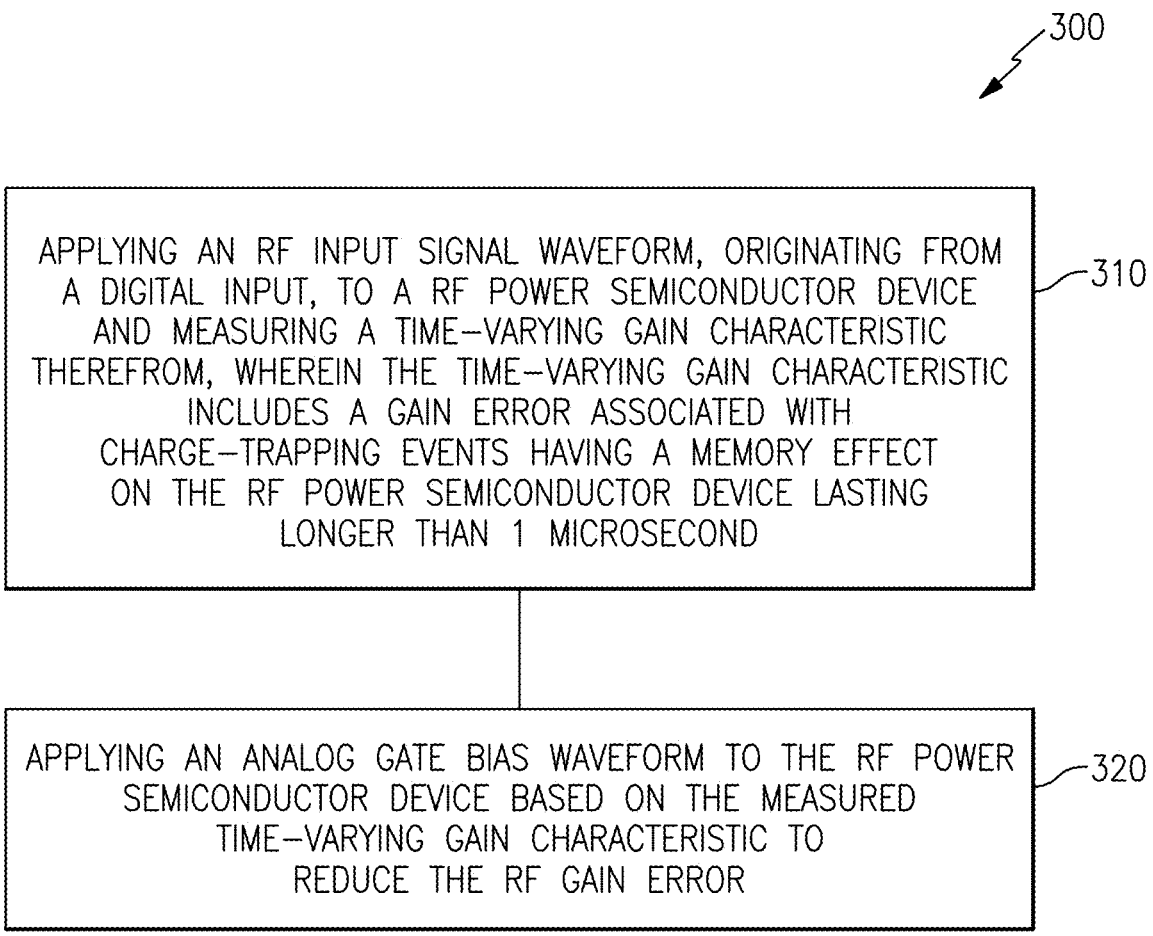
FIG. 3 illustrates a method of compensating for charge trapping and/or detrapping effects in a RF power semiconductor device, according to embodiments.

At least in part to address the above described needs to compensate for gain error in RF power amplifiers having RF power semiconductor devices that are prone to charge trapping and/or detrapping events having relatively long memory effects, e.g., GaN-based RF power devices, FIG. 3 illustrates a method 300 of compensating for such charge trapping and/or detrapping effects. The inventors have discovered that the adverse effects of charge trapping and/or detrapping can be substantially compensated by modulating the analog gate voltage on the RF power semiconductor device such as a GaN transistor included in the RF power amplifier. The modulation of the analog gate voltage according to embodiments of systems and methods described herein can substantially or essentially fully linearize the amplifier gain characteristics. The modulated analog gate waveform according to embodiments is systematically generated from a signal envelope generated from a digital input.

The illustrated method 300 includes applying 310 an RF input signal waveform, which originates from a digital input, to a power amplifier including a RF power semiconductor device and measuring a time-varying gain characteristic therefrom. The time-varying gain characteristic includes a gain error associated with charge trapping and/or detrapping events in the RF power semiconductor device. The charge trapping and/or detrapping can have a relatively long memory effect, e.g., longer than one microsecond. The method 300 additionally includes applying 320 an analog gate bias waveform to the RF power semiconductor device based on the measured time-varying gain characteristic to reduce the RF gain error. Adjusting 320 includes, e.g., systematically generating a modulated analog gate waveform from the envelope of the signal waveform by processing through a charge trap occupancy model with low pass filter characteristics with different rising and fall time constants. The determination of whether to increase or decrease the magnitude of the analog gate waveform is made based on whether the magnitude of the signal envelope exceeds a threshold value associated with charge trapping in the RF semiconductor device. The threshold value is continuously varied in response to the input signal waveform. A charge trap correction adaptation of the charge trap occupancy model includes a nonlinear optimization algorithm that is used to determine the coefficients of the charge trap occupancy model.

Figure 4A:
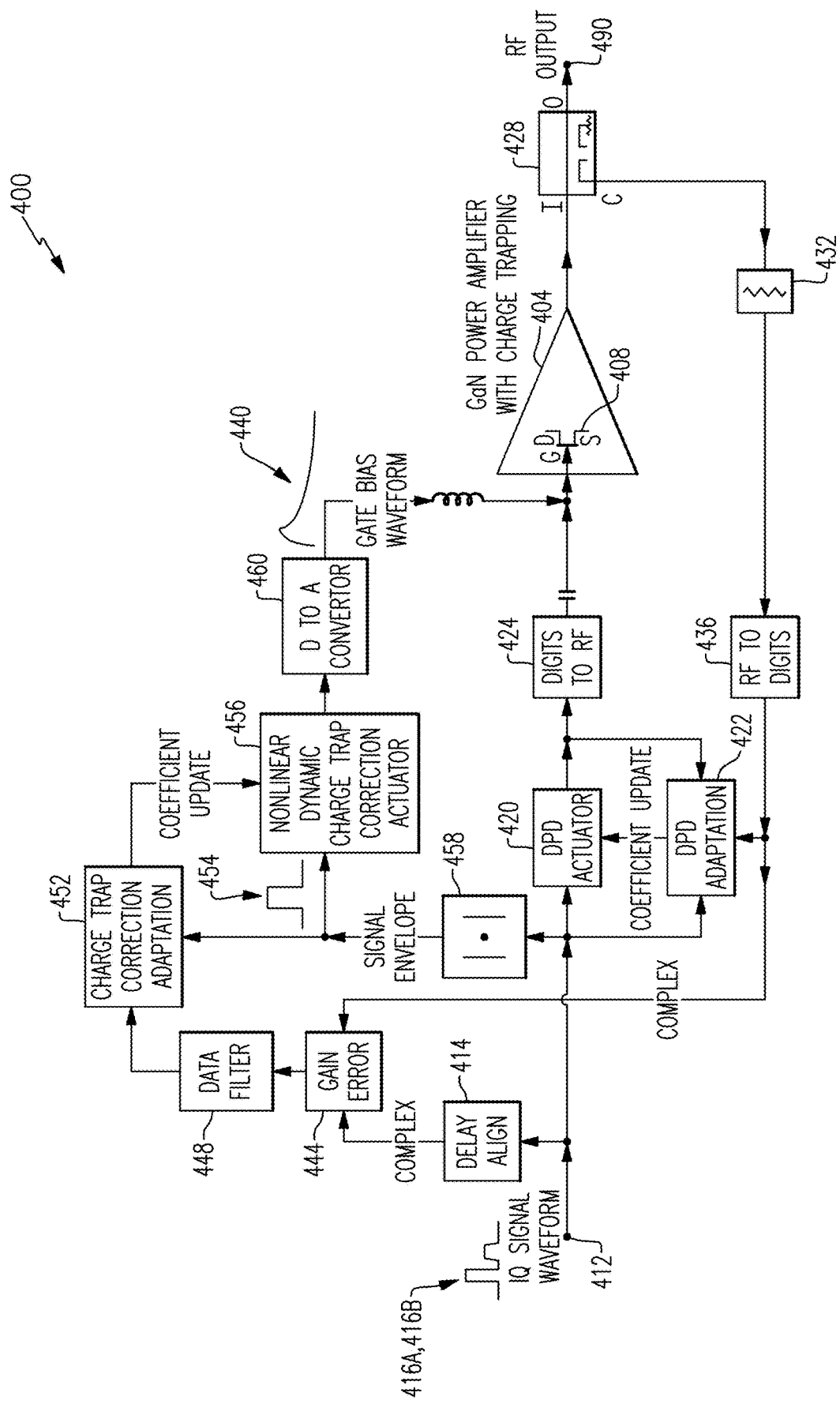
FIG. 4A illustrates a RF power transmitter system configured to compensate for charge trapping and/or detrapping effects in a RF power semiconductor device included therein, according to embodiments.

FIG. 4A schematically illustrates a block diagram of an RF power transmitter system 400 configured to compensate for charge-trapping effects in a RF power semiconductor device such as a field effect transistor (FET) 408 included therein, according to embodiments. The FET 408 includes a source (S), a gate (G) and a drain (D), and may be, without limitation a GaN HEMT similar to that illustrated in FIG. 1. The RF power transmitter system 400 includes a digital input terminal 412 configured to receive a digital input signal waveform 416A, 416B, a RF power amplifier 404 and an RF output terminal 490 configured to output an amplified RF output. An input terminal of the RF power amplifier 404 is electrically coupled to the digital input terminal 412 through a digital predistortion (DPD) actuator 420 and a digital-to-RF converter 424, through each of which the digital input signal waveform 416A/416B is processed before being amplified by the RF power amplifier 404. The DPD actuator 420 is coupled to a DPD adaptation module 422 configured to provide updated coefficients thereto. The amplified RF signal from the RF power amplifier 404 is received by an RF coupler 428, which is configured to feed an internal portion of the amplified RF signal back into the RF power transmitter system 400 to be used for DPD adaptation and calculating an analog gate bias waveform 440 to be applied to the FET 408 to compensate for charge trapping and/or detrapping effects therein.

Still referring to FIG. 4A, the RF power transmitter system 400 additionally includes a gain error computation module 444 electrically connected to a coupled output port (C) of the RF coupler 428 to receive the internal portion of the amplified RF signal therefrom, and electrically coupled to the digital input terminal 412. The gain error computation module 444 is electrically coupled to the RF coupler 428 through an attenuator 432 and a RF-to-digital converter 436, through each of which the RF internal signal portion is passed through before being inputted into the gain error computation module 444. The DPD adaptation module 422 is coupled to the RF-to-digital converter 436 to receive a portion of the signal therefrom to be used for updating DPD coefficients for the DPD actuator 420.

The gain error computation module 444 is electrically coupled to the digital input terminal 412 through a delay aligner 414 configured to time-align the signals being fed into the gain error computation module 444. Thus configured, the gain error computation module 444 is configured to receive and use the internal signal portion of the amplified RF signal from the RF coupler 428 and a portion of the digital input waveform 416A/416B that are time-aligned to compute the gain error of the RF power amplifier 404.

The RF power transmitter system 400 additionally includes a charge trap correction adaptation module 452 electrically coupled to the gain error computation module 444 through a data filter 448. The charge trap correction adaptation module 452 is additionally coupled to the input terminal 412 through a signal envelope generation module 458 configured to generate a signal envelope 454 comprising a real value signal from the digital input waveform 416A/416B. The charge trap correction adaptation module 452 and the signal envelope generation module 458 are connected to a nonlinear dynamic charge trap correction actuator 456 to feed respective signals thereto. The nonlinear dynamic charge trap correction actuator 456 is configured to receive the respective signals from the charge trap correction adaptation module 452 and the signal envelope generation module 458, and connected to an input terminal of the power amplifier 408 for feeding an analog gate bias waveform 440 thereto for compensating for charge trapping and/or detrapping effects in the FET 408 of the power amplifier 404. The gate bias waveform 440 is generated after an output of the nonlinear dynamic charge trap model 456 is converted to an analog signal by a digital-to-analog convertor 460.

In the following, still in reference to FIG. 4A, technical features and functions of various blocks of the RF power transmitter system 400 are described in operation, including applying 310 (FIG. 3) an RF input signal waveform, originating from a digital input waveform 416A/416B, to the power amplifier 404 and measuring a time-varying gain characteristic therefrom, wherein the time-varying gain characteristic includes a gain error associated with charge-trapping events having a memory effect on the power amplifier 404 lasting longer than 1 microsecond, and applying 320 (FIG. 3) the analog gate bias waveform 440 to the power amplifier based on the measured time-varying gain characteristic to reduce the RF gain error. It will be understood that various functional features of the RF power transmitter system 400 including algorithmic features may be stored on a non-transient medium such a volatile or nonvolatile memory device (not shown) and executed by a processor (not shown) included as part of the RF power transmitter system 400.

In operation, the digital input terminal 412 receives a digital input signal waveform 416A, 416B. The signal waveform 416A, 416B which may be a complex waveform, is received by the delay aligner 414, the signal envelope generator 458, the DPD actuator 420 and the DPD adaptation module 422. Subsequent processing of the signal waveform 416A, 416B through each of these paths is described below. In the following, while the signal waveform 416A, 416B may be a continuous signal, solely to facilitate the description of the operation of the RF power transmitter system 400, which constantly adjusts for charge trapping and/or detrapping effects in the FET 408, the signal waveform 416A, 416B may be described as including a first IQ signal waveform 416A and a second IQ signal waveform 416B, where the second IQ signal waveform 416B temporally lags the first IQ signal waveform 416A.

The signal waveform 416A, 416B received by the DPD actuator 420 is processed therethrough and subsequently converted to an RF signal by the digital to RF converter 424. Thus generated RF signal waveform from the digital-to-RF converter 424 is received as an input signal waveform by the power amplifier 404. The power amplifier 404 includes the FET 408, which can be, e.g., a power transistor such as the GaN-based HEMT described above with respect to FIG. 1. However, embodiments are not so limited and the FET 408 can be any other power transistor described above. The FET 408 can undergo charge trapping and/or detrapping events as described above with respect to FIG. 1. The power amplifier 404 also receives as an input the analog gate bias waveform 440, which is adapted to compensate for charge trapping and/or detrapping effects in the FET 408 based a time-varying gain characteristic thereof measured from a prior RF input signal waveform. That is, if the present RF input signal waveform being fed into the power amplifier 404 originates from the second IQ digital input signal waveform 416B, the analog gate bias waveform 440 may be an analog gate bias waveform generated using coefficients from the charge trap correction adaptation module 452 measured from the time-varying RF gain characteristic of the power amplifier 404 from a prior RF input signal waveform originating from the first IQ signal input signal waveform 416A. Thus, the RF input signal waveform being currently being inputted into the power amplifier 404 may be adjusted by the gate bias waveform 440 obtained based on a prior history of charge trapping and/or detrapping events in the FET 408. Taking the RF input signal waveform from the digital-to-RF converter 424 and the analog gate bias waveform 440 as a combined input, the power amplifier 404 outputs a significantly reduced time-varying gain characteristic. The significantly reduced time-varying gain characteristic includes a reduced gain error associated with charge trapping and/or detrapping events in the FET 408 of the power amplifier 404.

According to various implementations described herein, charge trapping and/or detrapping events in the FET 408 can have memory effects or recovery times in the FET 408, e.g., as measured from a drain current of the FET 408 as illustrated in FIG. 2, that are relatively long. The memory effects may be too long to be compensated using digital techniques such as DPD compensation. The memory effect or recovery time can be characterized in various ways. For example, for an n-channel device such as a GaN HEMT device in which a trapped charge may be electron, a trapping event may lead to a drain current reduction or "collapse," while a detrapping event may lead to a drain current recovery. Analogous effects may be observed in a p-channel device in which a trapped charge may be a hole. However, trapping and/or detrapping carrier types or their effects may not be so limited, and a trapped charge may be an electron and/or a hole in either type of devices, and their effects may manifest as different device characteristics, as described above.

In various implementations, the duration of the memory effect associated with a trapping and/or detrapping event can be characterized by one or more time periods or time constants. After a trapping and/or detrapping event, the effect on a device characteristic is temporarily altered, e.g., the drain current is reduced, to a level that is different relative to the device characteristic prior to the trapping and/or detrapping event. For example, the time period may correspond to a time period it takes for the device characteristic such as the drain current to recover to a fraction of the value prior to the trapping and/or detrapping event, e.g., 1/e, 40%, 50%, 60%, 70%, 80%, 90% relative to the value prior to the trapping and/or detrapping event. By way of example, in reference to a drain current trace similar to that shown in FIG. 2, the duration of the memory effect may correspond to the time it takes for the magnitude of the drain current to recover to a fraction the drain current before the trapping event.

According to various embodiments, the memory effect caused by trapping and/or detrapping effects in the FET 408 can have a duration lasting about 1-5 μs, 5-10 μs, 10-50 μs, 50-100 μs, 100-500 μs, 500-1000 μs, 1-5 ms, 5-10 ms, 10-50 ms, 50-100 ms, 100-500 ms, 500-1000 ms, 1-5 s, 5-10 s, or a value in a range defined by any of these values.

Still referring to FIG. 4A, the power amplifier 404 amplifies the RF input waveform received from the digital-to-RF converter with its bias voltage continuously adjusted by the analog gate bias waveform 440. Thus amplified RF signal from the power amplifier 404 is received by the RF coupler 428 at an input port (I). A portion of amplified RF signal is split into an RF output signal portion that is outputted through an output port (O) to the RF output terminal 490, and an internal signal portion that is fed back into the RF power transmitter system 400 through a coupled output port (C). The internal signal portion of the amplified RF signal is attenuated by the attenuator 432 connected to the RF coupler 428 and subsequently converted to a digital signal by the RF-to-digital converter 436. A portion of the digital signal from the RF-to-digital converter 436 is fed into the DPD adaptation module 422, and another portion of the digital signal from the RF-to-digital converter 436 is inputted into the gain error computation module 444.

Still referring to FIG. 4A, the DPD actuator 420 is coupled to the DPD adaptation module 422 for receiving DPD coefficients therefrom. The DPD coefficients may be updated based on the digital signal inputted to the DPD adaptation module 422. The combination of the DPD actuator 420 and the DPD adaptation module 422 is configured to compensate for any events, including charge trapping events, having relatively short memory effects (e.g., less than microseconds) on the FET 408 for reducing gain error of the power amplifier 404 resulting therefrom. In addition to the portion of the digital signal from the RF-to-digital converter 436, the DPD adaptation module 422 receives the signal waveform 416A, 416B before and/or after it is processed through the DPD actuator 420. Using these signals, the DPD adaptation module 422 may provide (updated) coefficients to the DPD actuator 420 for linearizing the gain of the power amplifier 404. The provided coefficients may be updated based on a comparison of signals received by the DPD adaptation module 422. For example, the combination of DPD actuator 420 and the DPD adaptation module 422 may be configured to incorporate and use an inverse nonlinear dynamic transfer function of the power amplifier 404 for the linearization. This transfer function can be modeled using, e.g., a Volterra series and/or various variations thereof. It will be appreciated that various DPD techniques have been used for linearization of power amplifiers, including mitigation of some memory effects. The inventors have discovered that, while thus applied DPD compensation may be effective in compensating for some relatively short memory effects arising from events that transiently affect the FET device characteristics, including effects of trapping and/or detrapping events that are relatively short, e.g., shorter than microseconds, the DPD compensation may not be sufficient in compensating for memory effects having a time constant that is substantially longer than microseconds. According to various embodiments, the DPD actuator 420 is configured to compensate for events having memory effects that are substantially shorter than time constants of trapping and/or detrapping effects compensated by the analog gate bias waveform 440. For example, the memory effects of charge and/or detrapping events compensated by the gate bias waveform 440 may be longer than memory effects compensated by the DPD actuator 420 by, e.g., a factor greater than 100, 1000, 10K, 100K, 1M, 10M or a value in a range defined by any of these values.

Still referring to FIG. 4A, the gain error computation module 444 is configured to compute a gain error caused by the charge trapping and/or detrapping events in the FET 408 using a time-varying gain characteristic outputted by the power amplifier 404. The gain error computation module 444 receives as its input two signals. First, the gain error computation module 444 receives as its input a portion of the digital signal from the RF-to-digital converter 436 including time-varying gain characteristic outputted by the power amplifier 404 as described above. Second, the gain error computation module 444 receives as input a delayed portion of the signal waveform 416A, 416B. The latter input is generated by the delay align module 414, which is configured to time align the signal waveform 416A, 416B with the digital signal from the RF-to-digital converter 436. The gain error may be computed by, e.g., comparing the two input signals and determining nonlinearity in the gain of the power amplifier 404 caused by the charge trapping and/or detrapping events in the FET 404.

Using the gain error caused by the charge trapping and/or detrapping events in the FET 408 as described above, the RF power transmitter system 400 is configured to adjust a subsequent RF input signal waveform 416B applied to the gate of the FET 404 using the analog gate bias waveform 440 to reduce the gain error of the power amplifier 404. The analog gate bias waveform 440 is generated using a charge trap correction adaptation module 452, which includes an algorithm for dynamically modeling trapping and/or detrapping events in the FET 408, as described herein. The algorithm may be configured to model trapping and/or detrapping in the FET 408 based on empirically obtained trapping and/or detrapping time constants.

The charge trap correction adaptation module 452 takes as its input two signals. The charge trap correction adaptation module 452 takes as its first input the gain error characteristic computed by a gain error computation module 444 as described above, and as its second input a signal envelope generated by the signal envelope generation module 456, which comprises a real value signal obtained from the signal waveform 416A, 416B.

Regarding the first input to the charge trap correction adaptation module 452, the inventors have discovered that a good indicator of changes in the amplifier characteristic due to charge trapping and/or detrapping events can be a filtered version of an amplifier gain error (and/or phase error) signal. Thus, according to embodiments, the charge trap correction adaptation module 452 takes as its first input a gain error signal as a function of time obtained from the gain error computation module 444, which is filtered by the data filter 448. In some implementations, the data filter 448 may be a low pass filter. This is because, as described above, the RF power transmitter system 400 is configured to compensate charge trapping and/or detrapping events having a memory effect lasting a relatively long time, e.g., 1 microsecond or greater. Thus, the low pass filter may be configured, e.g., to filter high frequency noise having frequency greater than about 50 kHz, 100 kHz, 500 kHz, 1 MHz, 5 MHz, 10 MHz, or a frequency in a range defined by any of these values or higher. The data filter 448 may also be configured in other ways to selectively reject data points that contain a low information to noise. Thus filtered gain error is fed into the charge trap correction adaptation module 452 as the first input. By doing so, the gain error signal can advantageously be first corrected as much as possible for nonlinearity effects arising from relatively high frequency noise. The gain error in I and/or Q (in-phase or out-of-phase) can also be used as a possible gain error indicator.

The second input to the charge trap correction adaptation module 452 includes a signal envelope obtained from signal envelope generation module 458. The signal envelope comprises real value signal obtained from the IQ signal waveform 416A, 416B.

Still referring to FIG. 4A, the charge trap correction adaptation module 452 comprises an algorithm, which may be stored on a non-transient medium such a volatile or nonvolatile memory device (not shown) and executed by a processor (not shown) included as part of the RF power transmitter system 400. The charge trap correction adaptation module 452 is configured to learn an adjustment to be made to the gate modulation waveform for the FET 408 using the two input signals described above, including the first input comprising the gain error characteristic computed by the gain error computation module 444, which has been filtered using the data filter 448 after first applying a DPD compensation using the DPD actuator 420, and the second input comprising a signal envelope generated by the signal envelope generation module 458, which comprises a real value signal obtained from the IQ signal waveform 416A, 416B. The charge trap correction adaptation module 452 includes a charge trap occupancy model, described herein.

Without being bound to theory, in one implementation, the charge trap occupancy model presumes the existence of a charge trap occupancy state, which describes, at a given point in time, the occupancy level of the trapped charges that are affecting the threshold voltage of the FET 408. For example, in this implantation, the charge trap occupancy state of 0 may correspond to a state having no trapped charges in the charge trap sites, while a charge trap occupancy state of 1 may correspond to a state in which the charge trap sites are fully occupied. For example, when the charge trap occupancy state is 1 in a GaN HEMT, the device may behaves as if its gate voltage is more negative that that applied to the gate compared to when the charge trap occupancy state is 0. When the charge trap occupancy is between 0 and 1, there may be a smooth (e.g., linear) transition in effective gate voltage behavior in this implementation.

In some implementations, the charge trap occupancy model models the charge traps to include "dynamically non-linear" traps, in which the time constant of the capture process is relatively very different from that of the emission process. For example, the capture (filling) time constant of the traps is very fast compared to the emission (emptying) time constant and the emission time constant is very temperature dependent while the capture time is not a strong function of temperature. In some other implementations, the charge trap occupancy model models the charge traps to include "dynamically linear" traps, in which the capture and emission processes have relatively similar time constants.

According to embodiments, the charge trap occupancy model uses a threshold value of the signal envelope to determine whether the charge trap occupancy should be increased or decreased. When the signal envelope from the signal envelope generator 458 obtained as described above is equal to or exceeds the envelope threshold value, the charge trap occupancy state may increased to a higher value. On the other hand, when the signal envelope from the signal envelope generator 458 obtained as described above is below the envelope threshold value, the charge trap occupancy state may kept the same or decreased. According to embodiments, the envelope threshold is not kept constant, but rather dynamically varied as a function of the temporal history of the signal envelope. For example, the envelope threshold may be varied based on the history of the signal envelope lasting, e.g., hundreds of microseconds, milliseconds, tens of milliseconds, hundreds of milliseconds, or a time in a range defined by any of these values.

According to some embodiments, the charge trap occupancy model models the charging up of the charge traps and the discharging of the charge traps as rising and decaying nonlinear functions, e.g. exponential functions. In some implementations, e.g., where the FET 408 is a GaN HEMT, the time constant of discharging decay is modeled to be significantly slower that the time constant of charging. For example, emission or discharging time constant may have a value of about 1-5 µs, 5-10 µs, 10-50 µs, 50-100 µs, 100-500 µs, 500-1000 µs, 1-5 ms, 5-10 ms, 10-50 ms, 50-100 ms, 100-500 ms, 500-1000 ms, 1-5 s, 5-10 s, or a value in a range defined by any of these values. On the other hand, capture of charging time constant may be substantially shorter, e.g., picoseconds to microseconds. Thus, a ratio of the discharging time constant to a charging time constant may be 100, 1000, 10K, 100K, 1M, 10M, 100M, or a value in a range defined by any of these values.

Based on the above, according to embodiments, the parameters that are optimized to obtain the adjusted analog bias waveform 440 includes a charging time constant (a1), a discharging time constant (a2), a scaling factor (c) for scaling the signal envelope to volts, and an envelope threshold value above which trapping apparently occurs based on the measured gain error. Some power devices make require multiple sets of charging and discharging parameters to account for the multiple trapping/detrapping mechanisms and locations in the device.

In summary, key attributes of the charge trap occupancy model include:

A low pass filter type response but with a nonlinear, e.g., exponential-like, rise and fall times that are very different in magnitudes.

A continuously varying feedback threshold to determine whether the charge trap occupancy level should be increased or decreased. The threshold depends on the last charge trap occupancy level.

In one implementation, the charge trap occupancy model can include a mathematical model that can be a non-linear function, e.g., including rising and falling exponential functions, of as few as 4 coefficients including rising (charging or capture) time constant (a1), falling (discharging or emission) time constant (a2), a charging threshold constant (THRESHOLD), and a scaling factor (SCALING) for converting the signal envelope to volts. However, embodiments are not so limited and in other implementations, the model can be extended to allow for powers of the input envelope level, multiple exponential time constants and multiple thresholds.

A non-linear optimization algorithm to determine the coefficients of the model. An example algorithm that can be used is a gradientless algorithm, such as Nelder-Mead using simplex methods, which can be used to determine the coefficients.

Still referring to FIG. 4A, the nonlinear dynamic charge trap correction actuator 456 is receives as inputs respective signals from the charge trap correction adaptation module 452 and the signal envelope generation module 458, described further below with respect to FIG. 4B. After processing the signals through the nonlinear dynamic charge trap correction actuator 456, a digital-to-analog (D to A) convertor is used to generate the analog gate bias waveform 440 for the FET 408 included in the power amplifier 404 as described above. Thus, the analog gate bias waveform 440, which is adapted to compensate for charge trapping and/or detrapping effects of the FET 408, is applied to the gate of the FET 408 in addition to the RF signal outputted by the digital-to-RF converter 424. As described above, if the present RF input signal waveform being fed into the power amplifier 404 originates from the second digital input signal waveform 416B, the analog gate bias waveform 440 may be a waveform generated using measured time-varying RF gain characteristic of the power amplifier 404 from a prior RF input signal waveform originating from the first IQ signal input signal waveform 416A.

According to various embodiments, the analog gate bias waveform 440 has a lower frequency compared to the RF signal waveform applied to the gate of the FET 408. For example, a ratio of the frequency of the RF signal waveform applied to the gate of the FET 408 to that of the analog gate bias waveform to may be 10, 100, 1000, or a value in a range defined by any of these values. For example, the frequency of the analog gate bias waveform 440 may have a frequency of 10-100 kHz, 100 kHz-1 MHz, 1-10 MHz, 10-100 MHz or a frequency in range defined by any of these values.

Figure 4B:
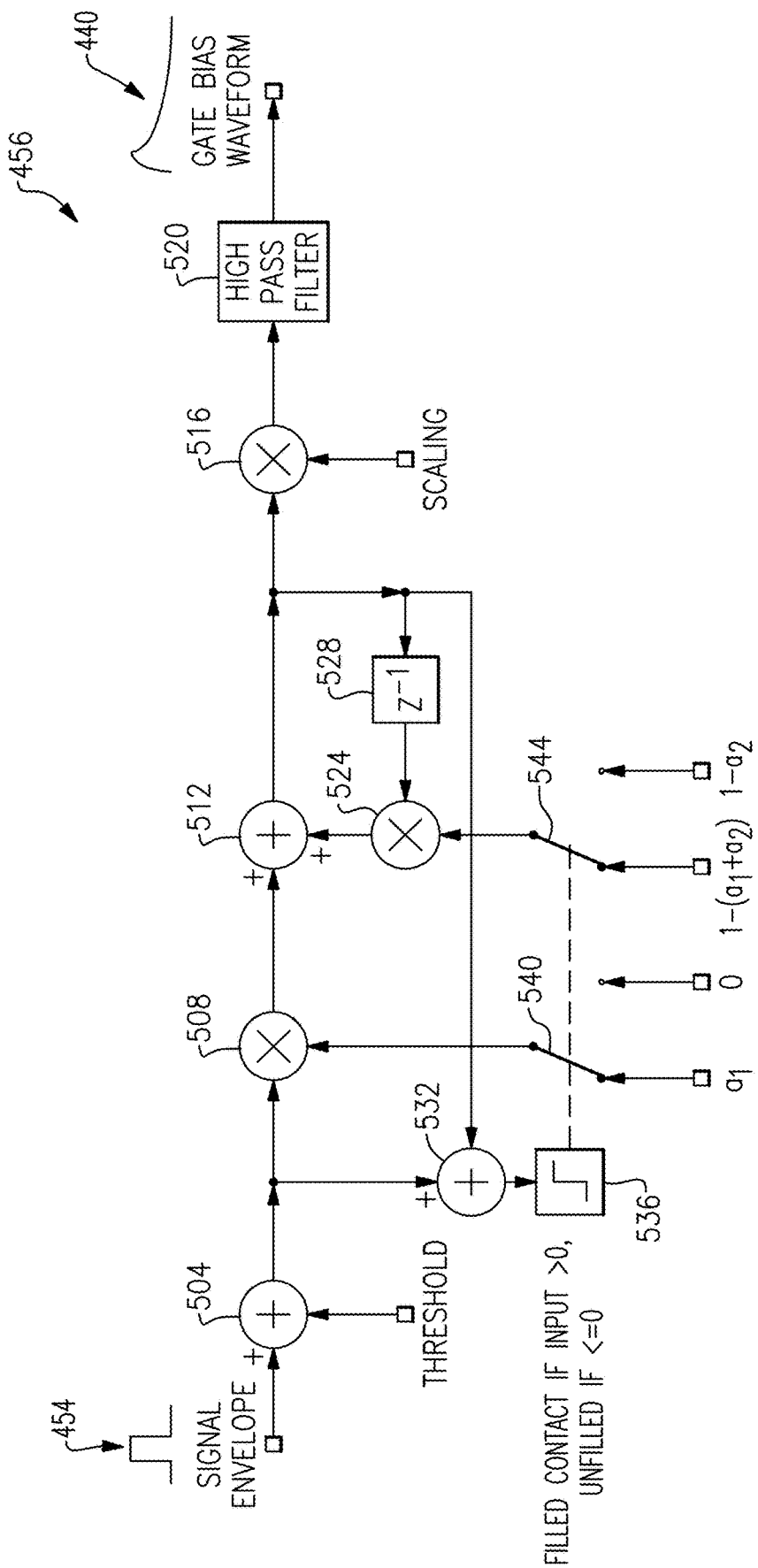
FIG. 4B illustrates a nonlinear dynamic charge trap correction actuator for compensating charge trapping and/or detrapping effects in a RF power semiconductor device, according to embodiments.

FIG. 4B illustrates an example of a nonlinear dynamic charge trap correction actuator 456 shown in FIG. 4A. As described above, the nonlinear dynamic charge trap correction actuator 456 takes as an input the signal envelope 454 (FIG. 4A), which is a relatively high bandwidth baseband signal envelope, and as a further input the set of periodically updated actuator coefficients from the charge trap correction adaptation module 452 (including, e.g., THRESHOLD, $a_1$, $a_2$ and SCALING coefficients). The nonlinear dynamic charge trap correction actuator 456 includes a plurality of adders 504, 512, 532, a plurality of multipliers, 508, 516 a comparator 536 switches 540, 544 and a $Z^{-1}$ delay operator 528 that are arranged to update the coefficients of the charge trap occupancy model of the charge trap correction adaptation module 452. As described above, the THRESHOLD coefficient is associated with the magnitude of the RF signal waveform or the signal envelope thereof below which gain variations of the power amplifier 404 caused by charge trapping is insignificant or significantly less frequently observed. The nonlinear dynamic charge trap correction actuator 456 comprises a first order low pass digital filter, e.g., infinite impulse response (IIR)-type filter with different charging and discharging coefficients $a_1$ and $a_2$, respectively, which uses a comparator 536 to determine whether the filter is charging or discharging at any given point in time. The output of the digital filter can be interpreted as a measure of the charge trapping state and is fed back to the comparator 536 to be compared with the instantaneous signal envelope to decide whether to charge or discharge the electronic filter. In the illustrated state, the switches 540, 544, which are switched together, are shown in the charging state (the switch 540 at a1 and the switch 544 at 1−(a1+a2)) where the magnitude of the signal envelope is equal or greater than the output from the digital filter. When the magnitude of the signal envelope is less than the output from the digital filter, the switches 540, 544 are switched together to the discharge state (the switch 540 at 0 and the switch 544 at 1−a2). The SCALING coefficient is associated with a conversion factor for converting the output of the electronic filter to volts, to take into account of the fact that different FETs need different amount of (millivolts) gate modulation to compensate for the trapping and/or detrapping effect. An optional high pass filter 516 may be included because it may not always possibly to take the FET device to a known state of charge trapping level at a given point in time. The optional high pass filter 520 may be used if it is not possible to periodically "zero" the charge trap state of the FET device. It will be appreciated that the nonlinear dynamic charge trap correction actuator 456 can be extended to higher levels of complexity to include dynamic temperature effects of trapping behaviour or add multiple filters (IIR filters) allowing for multiple charging and discharging coefficients.

Figure 5:
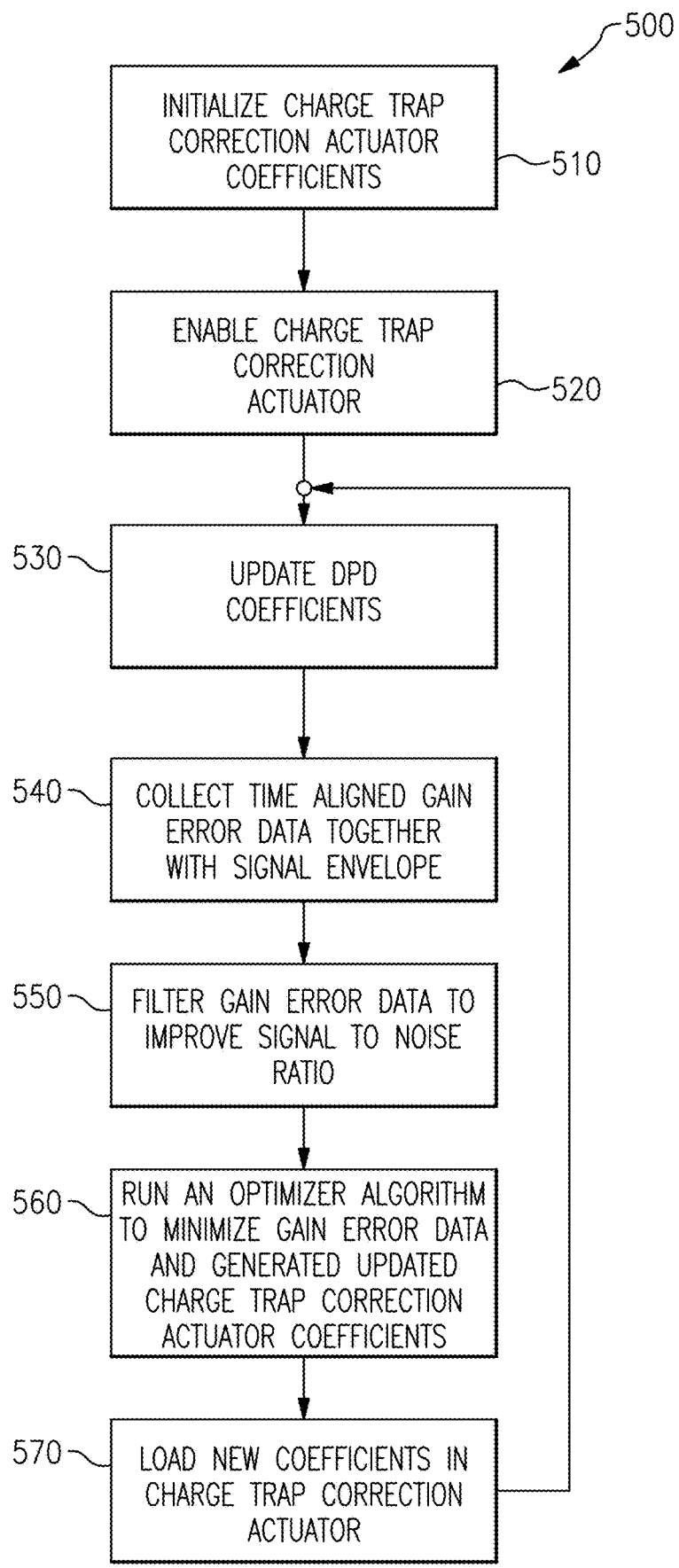
FIG. 5 is a flow chart illustrating an algorithm for dynamically computing an analog gate bias waveform to compensate for charge trapping and/or detrapping effects in a RF power semiconductor device, according to embodiments.

FIG. 5 is a flow chart illustrating an algorithmic method 500 for dynamically determining an analog gate bias waveform to be applied to the gate of the FET 408 (FIG. 4A) to compensate for charge trapping and/or detrapping effects therein, according to embodiments. The method 500 includes initializing 510 the coefficients (THRESHOLD, a1, a2, and SCALING) of the nonlinear dynamic charge trap correction actuator 456 (FIG. 4A) and enabling 520 the nonlinear dynamic charge trap correction actuator 456 (FIG. 4A). Subsequently, the method 500 includes updating the coefficients of the DPD actuator 420 (FIG. 4A). Then, as described above, the method 500 proceeds to collect 540 time aligned gain error data from the gain error module 444 (FIG. 4A) and the signal envelope 458 (FIG. 4A) comprising a real signal from the signal envelope generator 458 (FIG. 4A) and to filter 550 the computed gain error using the data filter 448 (FIG. 4A) to improve the signal to noise ratio of the gain error. Subsequently, the method 500 proceeds to running 560 an optimizer algorithm, using the charge trap correction adaptation module 452 (FIG. 4A), to reduce or minimize the gain error of the power amplifier 404 (FIG. 4A), and to generate updated the coefficients (THRESHOLD, a1, a2, SCALING) of the nonlinear dynamic charge trap correction actuator 456 (FIG. 4A), and to load 570 the newly updated coefficients in the nonlinear dynamic charge trap correction actuator 456 (FIG. 4A).

Thus generated analog gate bias waveform 440 (FIGS. 4A, 4B) has a frequency lower than that of the RF signal waveform, as described above. The gate bias waveform 440 may have a voltage swing of, e.g., 50-100 mV, 100-200 mV or 200-500 mV, or a value in a range defined by any of these values, which is added to a DC gate bias of, e.g., −5 to −2 V for GaN devices.

Experimental Example of Charge Trapping Compensation in GaN HEMT

Figure 6A:
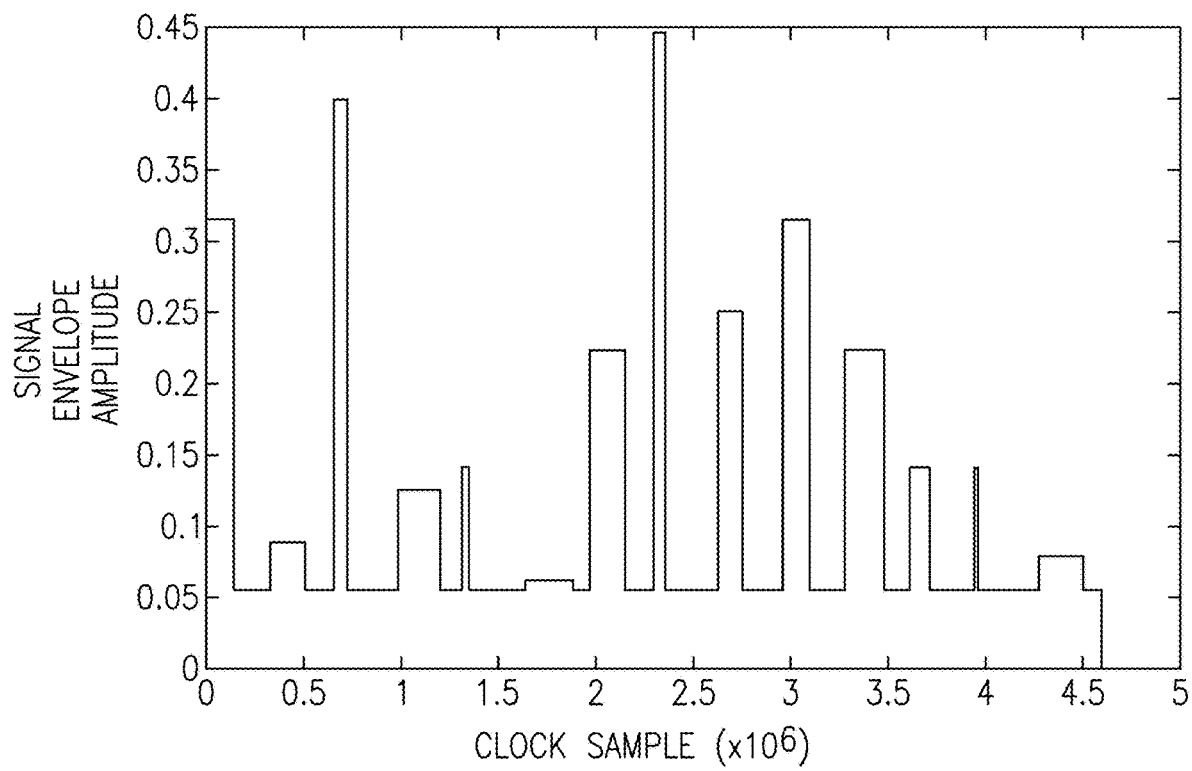
FIG. 6A is a graph illustrating an example signal envelope to illustrate the embodiments in operation.
Figure 6B:
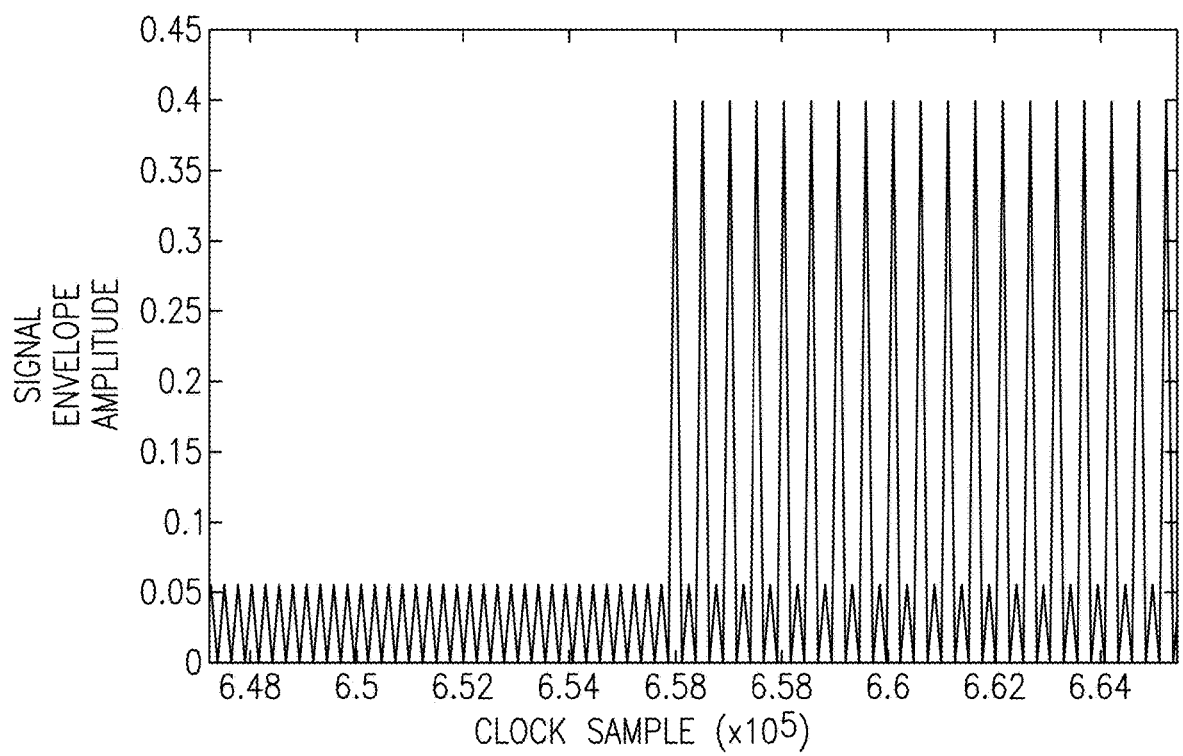
FIG. 6B is a magnified section of the graph shown in FIG. 6A.

In the following, an experimental example of charge trapping compensation implementation is illustrated according to embodiments. FIG. 6A is a graph illustrating an experimental example signal envelope of a 10 ms waveform applied to the gate of a GaN HEMT gate, by way of illustration of the embodiments disclosed herein. The signal envelope represents a signal having a real value that can be generated by the signal envelope generation module 458 (FIG. 4A) from an IQ signal waveform 416A, 416B (FIG. 4A). By way of illustration, the duration of 10 ms was split up into 15 equal periods each being ⅔ ms long in duration and having a high power portion and a low power portion. The amplitude and duration of the high power portions of each period is chosen from random numbers while the level of the low power portion set at the same level that is a level where charge trapping effects have not been observed. The vertical axis represents the linear envelope value and the horizontal axis represents the time in clock samples. FIG. 6B is a magnified section of the graph in FIG. 6A.

Figure 7A:
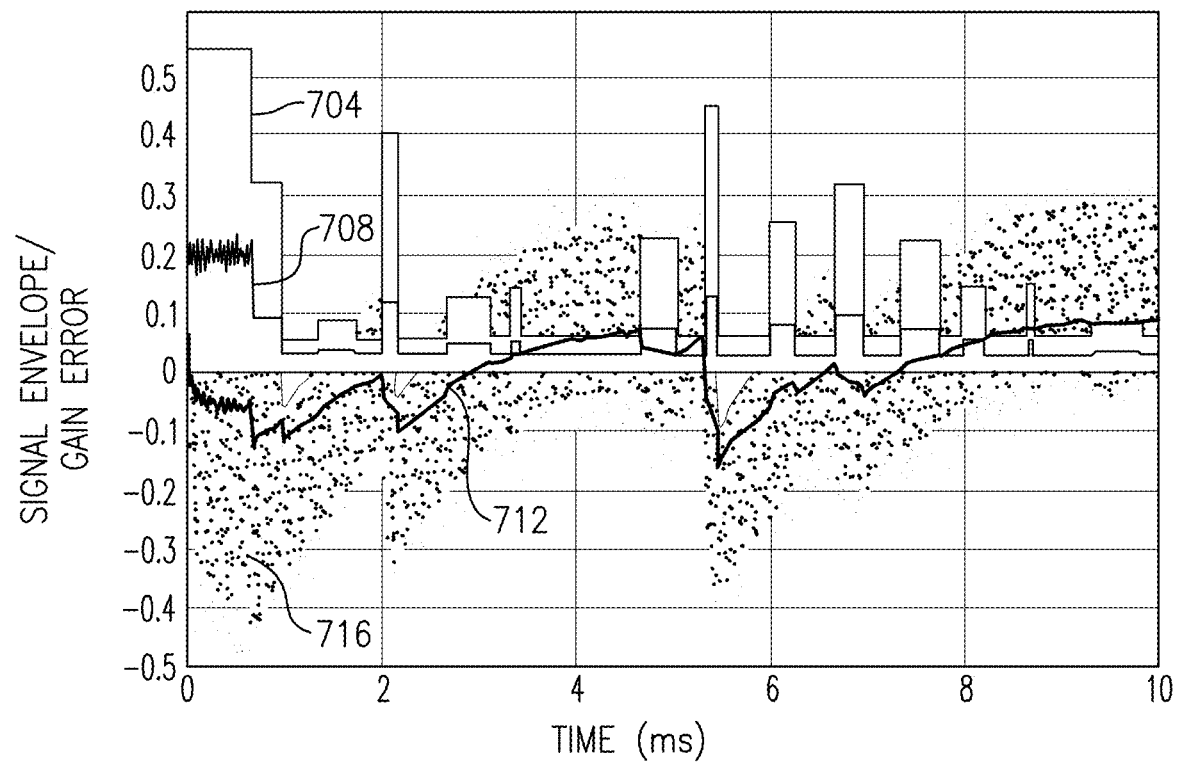
FIG. 7A is a graph of overlaid example traces of a signal envelope, gain error, low-pass filtered gain error and low-pass filtered signal envelope, with application of digital predistortion (DPD) compensation but without application of compensation for charge trapping and/or detrapping in a RF power semiconductor device.

FIG. 7A is a graph of overlaid traces of a signal envelope 704, measured gain error 716, low-pass filtered (at 100 kHz) gain error 712 and low-pass filtered (at 100 kHz) signal envelope 708, with application of digital predistortion (DPD) compensation but without application of compensation for charge trapping and/or detrapping in a RF power semiconductor device.

Figure 7B:
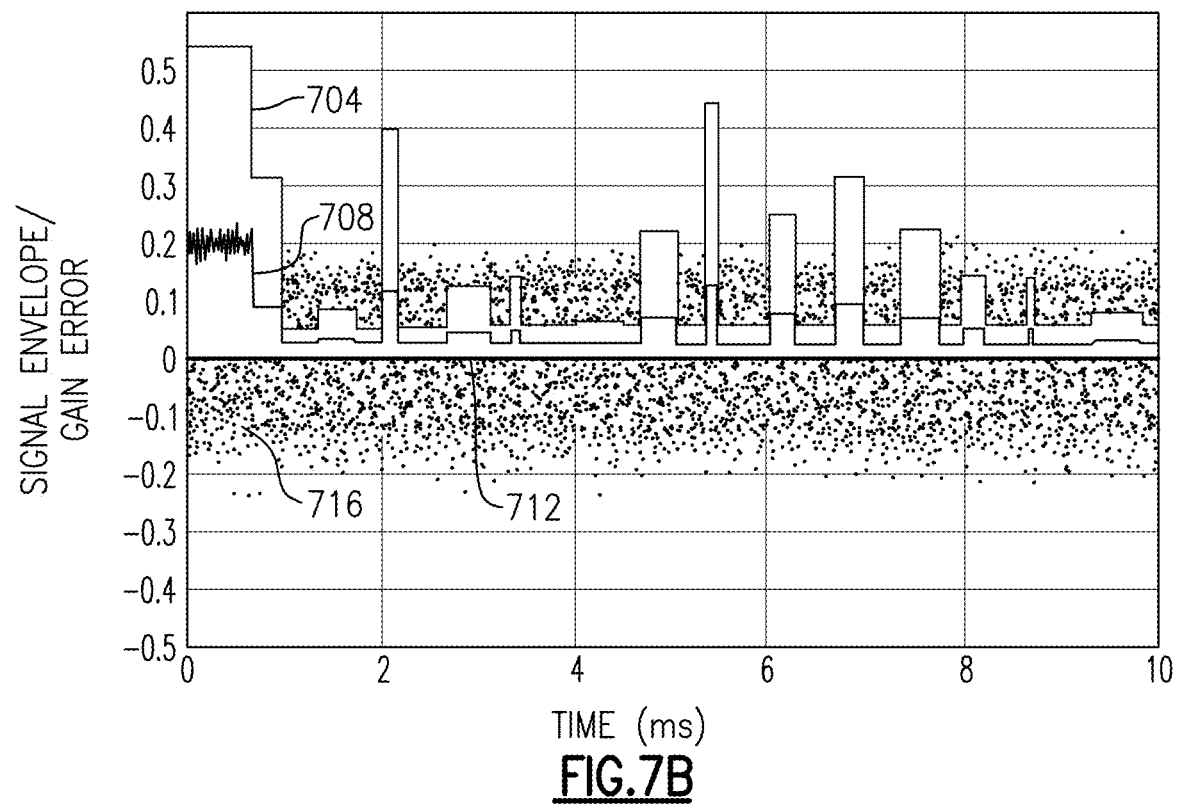
FIG. 7B is a graph of overlaid example traces of a signal envelope, gain error, low-pass filtered gain error and low-pass filtered signal envelope, with application of DPD compensation and with application of compensation for charge trapping and/or detrapping in a RF power semiconductor device, according to embodiments.

FIG. 7B is a graph of overlaid traces of a signal envelope 704, measured gain error 716, low-pass filtered (at 100 kHz) gain error 712 and low-pass filtered (at 100 kHz) signal envelope 708, with application of DPD compensation and with application of compensation for charge trapping and/or detrapping in a RF power semiconductor device, according to embodiments. It will be appreciated that a comparison between the low-pass filtered gain error traces 712 before after the application of compensation for trapping and/or detrapping effects shows that the gain error has essentially been reduced to zero.

Figure 8A:
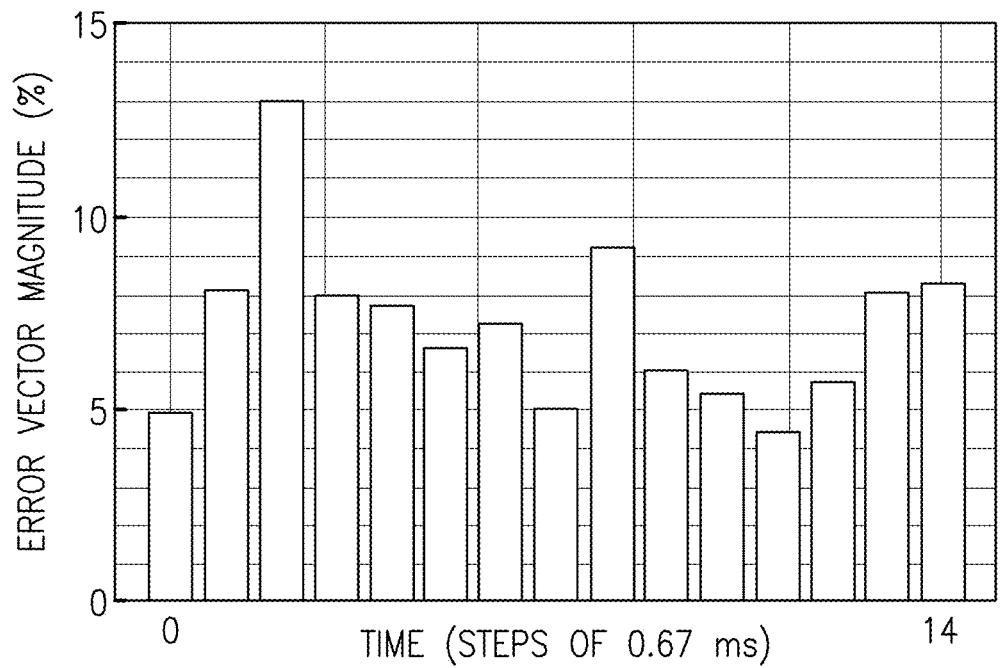
FIG. 8A is a graph of waveform error vector magnitude (EVM) corresponding to the example signal envelope illustrated in FIG. 6A without application of DPD compensation and without application of charge trapping and/or detrapping compensation in a RF power semiconductor device.
Figure 8B:
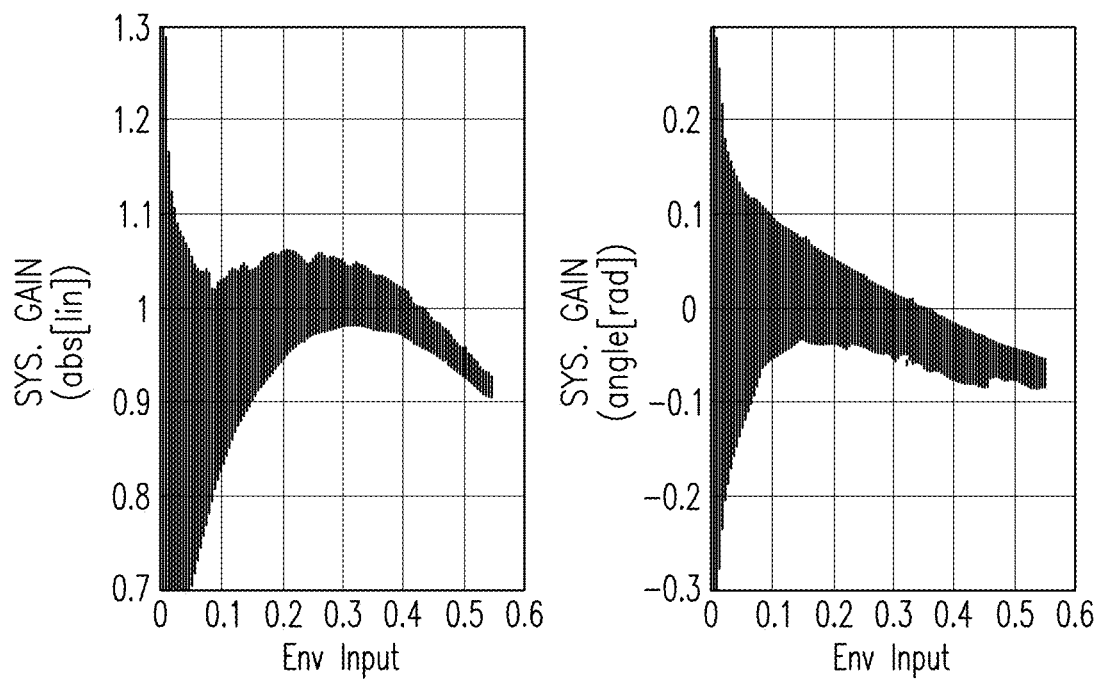
FIG. 8B is an AM-AM/PM plot corresponding to the example signal envelope illustrated in FIG. 6A without application of DPD compensation and without application of charge trapping and/or detrapping compensation in a RF power semiconductor device.

FIG. 8A is a graph of waveform error vector magnitude (EVM) corresponding to the example signal envelope illustrated in FIG. 6A without application of DPD compensation and without application of charge trapping and/or detrapping compensation in a RF power semiconductor device. FIG. 8B is an AM-AM/PM plot corresponding to the example signal envelope illustrated in FIG. 6A without application of DPD compensation and without application of charge trapping and/or detrapping compensation in a RF power semiconductor device.

Figure 9A:
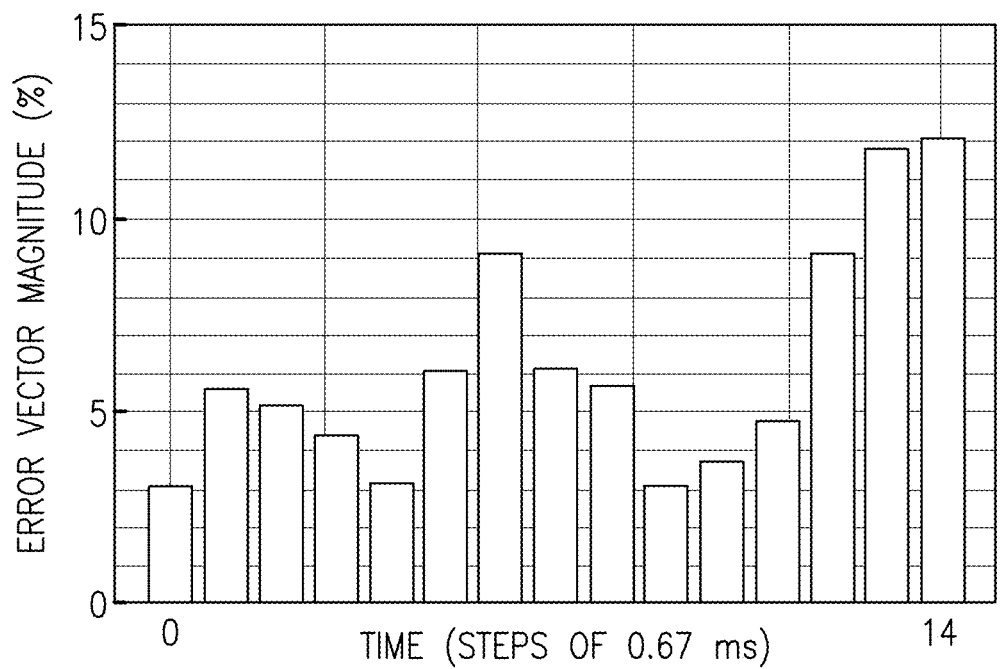
FIG. 9A is a graph of waveform error vector magnitude (EVM) corresponding to the example signal envelope illustrated in FIG. 6A with the application of DPD compensation but without application of charge trapping and/or detrapping compensation in a RF power semiconductor device.
Figure 9B:
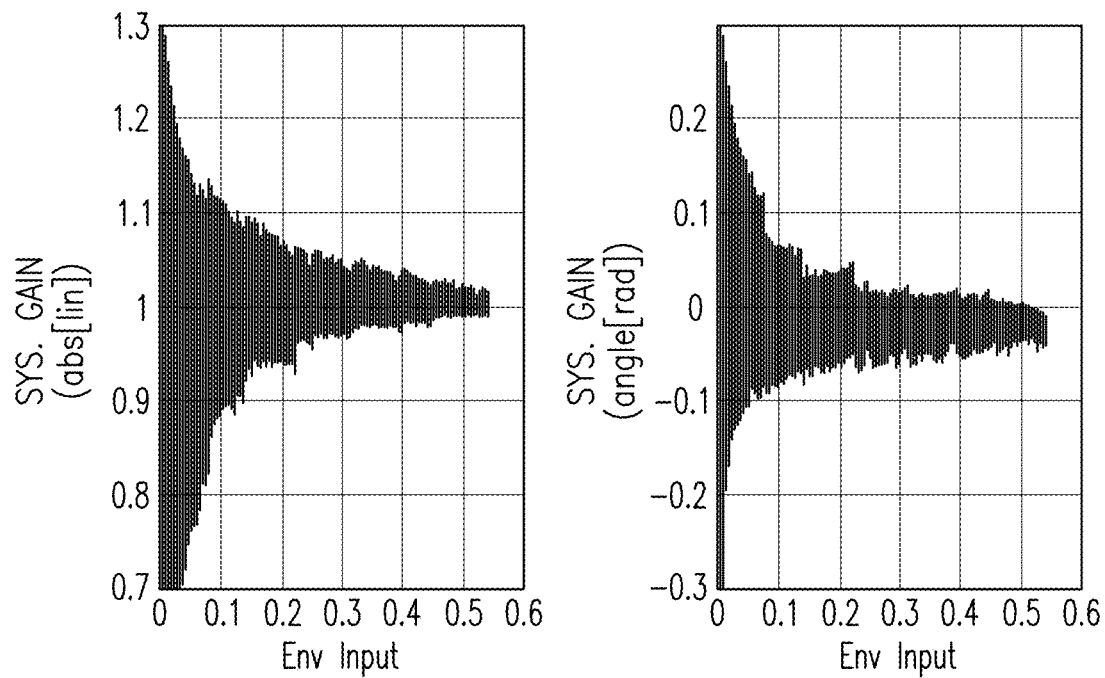
FIG. 9B is an AM-AM/PM plot corresponding to the example signal envelope illustrated in FIG. 6A with application of DPD compensation but without application of charge trapping and/or detrapping compensation in a RF power semiconductor device.

FIG. 9A is a graph of waveform error vector magnitude (EVM) corresponding to the example signal envelope illustrated in FIG. 6A with the application of DPD compensation but without application of charge trapping and/or detrapping compensation in a RF power semiconductor device. FIG. 9B is an AM-AM plot corresponding to the example signal envelope illustrated in FIG. 6A with application of DPD compensation but without application of charge trapping and/or detrapping compensation in a RF power semiconductor device.

Figure 10A:
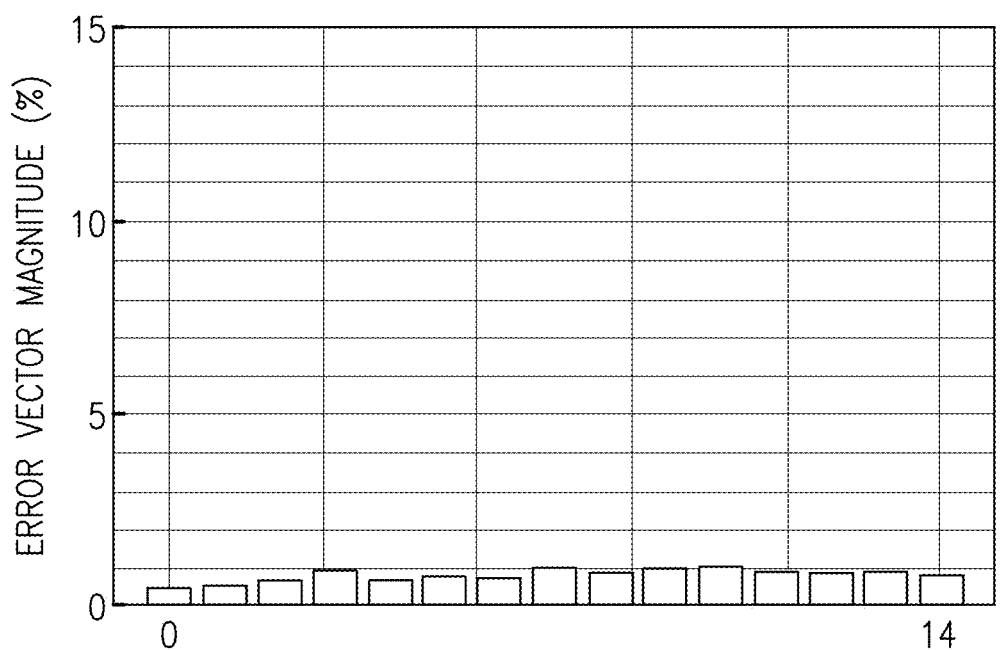
FIG. 10A is a graph of waveform error vector magnitude (EVM) corresponding to the example signal envelope illustrated in FIG. 6A with application of DPD compensation and with application of charge trapping and/or detrapping compensation in a RF power semiconductor device, according to embodiments.
Figure 10B:
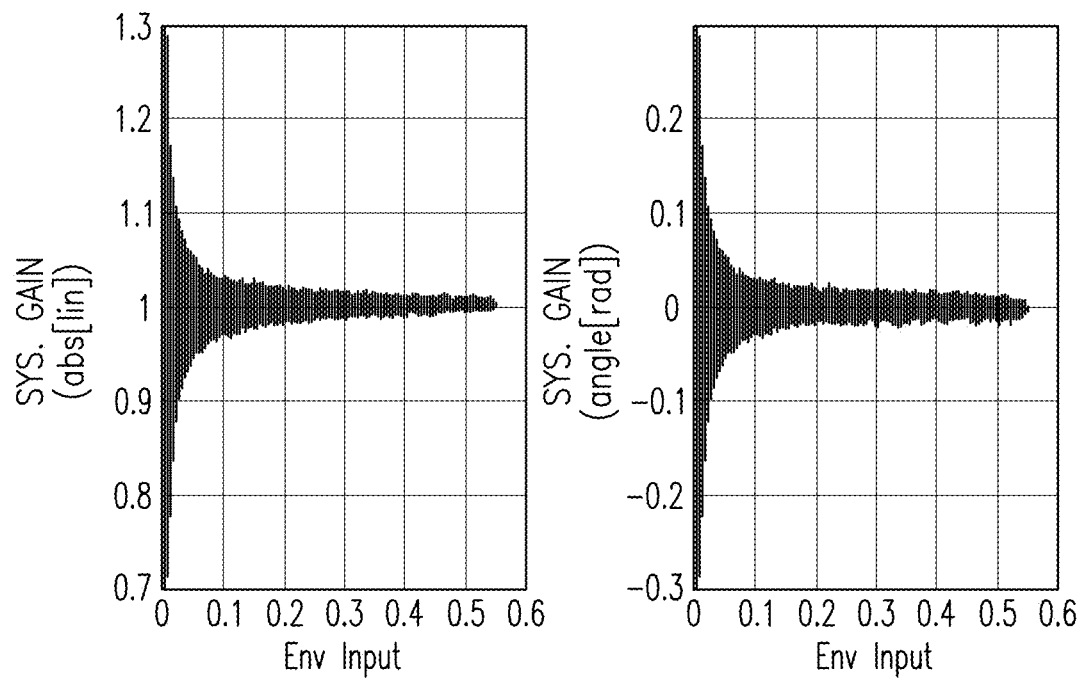
FIG. 10B is an AM-AM/PM plot corresponding to the example signal envelope illustrated in FIG. 6A with application of DPD compensation and with application of charge trapping and/or detrapping compensation in a RF power semiconductor device, according to embodiments.

FIG. 10A is a graph of waveform error vector magnitude (EVM) corresponding to the example signal envelope illustrated in FIG. 6A with application of DPD compensation and with application of charge trapping and/or detrapping compensation in a RF power semiconductor device, according to embodiments. FIG. 10B is an AM-AM/PM plot corresponding to the example signal envelope illustrated in FIG. 6A with application of DPD compensation and with application of charge trapping and/or detrapping compensation in a RF power semiconductor device, according to embodiments.

It will be appreciated that, based on a comparison of the EVMs, AM-AM/PM plots, the charge trapping compensation according to embodiments can reduce the EVM to lower than 1%.

Figure 11:
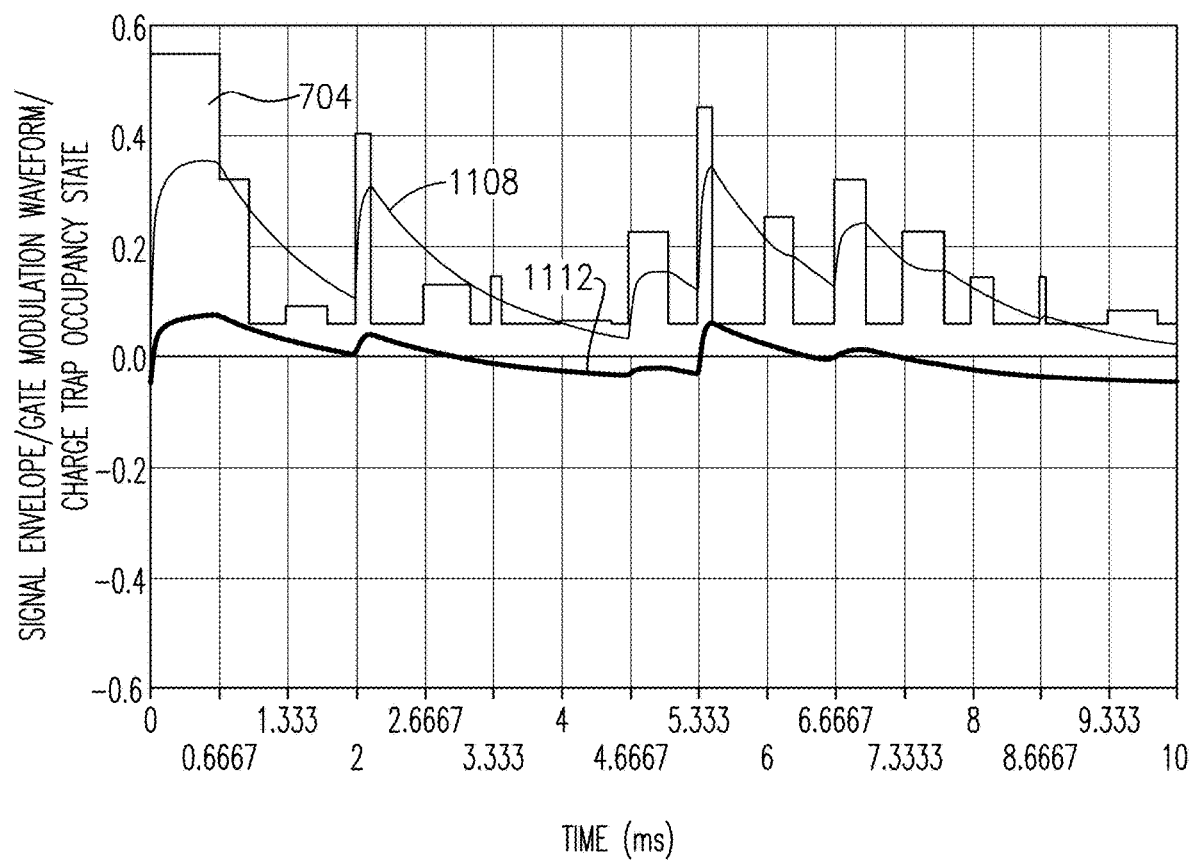
FIG. 11 is a graph of overlaid example traces of a signal envelope, charge trap occupancy and analog gate bias waveform adapted to compensate for gain error associated with charge trapping and/or detrapping events in a RF power semiconductor device, according to embodiments.

FIG. 11 is a graph of overlaid example traces of a signal envelope 704, charge trap occupancy 1108 and the analog gate bias waveform 1112 generated according to embodiments described herein, which is adapted to compensate for gain error associated with charge trapping and/or detrapping events in a RF power semiconductor device.

In the foregoing, it will be appreciated that any feature of any one of the embodiments can be combined or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, radar systems, military communications and countermeasures etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A radio frequency (RF) power transmitter system, comprising:
   a RF power semiconductor device configured to output a time-varying gain characteristic from a RF input signal waveform originating from a digital input, wherein the time-varying gain characteristic includes a gain error associated with a charge-trapping event having a memory effect on the RF power semiconductor device lasting longer than 1 microsecond; and
   circuitry comprising a digital-to-analog converter configured to apply an analog gate bias waveform, as a further input to the RF input signal waveform, to the RF power semiconductor device based on the time-varying gain characteristic to reduce the gain error.

2. The RF power transmitter of claim 1, wherein the RF power semiconductor device comprises a GaN-based high electron mobility transistor.

3. The RF transmitter system of claim 1, wherein the circuitry is configured to apply the analog gate bias waveform to a gate of the RF power semiconductor device.

4. The RF transmitter system of claim 3, wherein the analog gate bias waveform has a lower frequency compared to the RF input signal waveform.

5. The RF transmitter system of claim 3, wherein the analog gate bias waveform has a rise time that is substantially shorter than a fall time.

6. The RF transmitter system of claim 1, wherein the circuitry comprises a charge trap correction actuator configured to generate a digital signal that is converted to the analog gate bias waveform for reducing the gain error, wherein the charge trap correction actuator is configured to generate the digital signal based on an algorithm that models a charge trapping behavior and a charge detrapping behavior in the RF power semiconductor device.

7. The RF transmitter system of claim 6, wherein the algorithm is configured to receive as an input the time-varying gain characteristic outputted by the RF power semiconductor device.

8. The RF transmitter system of claim 7, wherein the algorithm is configured to receive as a further input a signal envelope comprising a real value computed from the digital input.

9. A radio frequency (RF) power transmitter device, comprising:
   a RF power semiconductor device configured to receive as an input a RF signal waveform originating from a digital input, and to receive as a further input to the RF signal waveform, from circuitry comprising a digital-to-analog converter, an analog gate bias waveform adapted to compensate for gain error associated with charge-trapping events having a memory effect lasting longer than 1 microsecond on the RF power semiconductor device,
   wherein the analog gate bias waveform is generated from a time-varying gain characteristic outputted by the RF power semiconductor device.

10. The RF power transmitter device of claim 9, wherein the RF power semiconductor device comprises a GaN-based high electron mobility transistor comprising a gate for receiving the analog gate bias waveform.

11. The RF power transmitter device of claim 10, wherein, the gate is connected to a charge trap correction actuator configured to generate a digital signal that is converted to compensate for the gain error, wherein the charge trap correction actuator is configured to generate the analog gate bias waveform based on an algorithm that models a charge trapping behavior and a charge detrapping behavior in the RF power semiconductor device.

12. The RF power transmitter device of claim 11, wherein the algorithm is configured to receive as an input the time-varying gain characteristic outputted by the RF power semiconductor device.

13. The RF power transmitter device of claim 11, wherein the algorithm is configured to receive as a further input a signal envelope comprising a real value computed from the digital input.

14. A method of compensating for charge-trapping effects in a radio frequency (RF) power semiconductor device, the method comprising:
   applying an RF input signal waveform, originating from a digital input, to a RF power semiconductor device and measuring a time-varying gain characteristic therefrom, wherein the time-varying gain characteristic includes a gain error associated with charge-trapping events having a memory effect on the RF power semiconductor device lasting longer than 1 microsecond; and
   applying an analog gate bias waveform as a further input to the RF input signal waveform, using circuitry comprising a digital-to-analog converter, to the RF power semiconductor device based on the measured time-varying gain characteristic to reduce the RF gain error.

15. The method of claim 14, wherein the RF power semiconductor device comprises a GaN-based high electron mobility transistor.

16. The method of claim 14, wherein applying the analog gate bias waveform comprises applying to a gate of the RF power semiconductor device.

17. The method of claim 16, wherein applying the analog gate bias waveform comprises applying the analog gate bias waveform having a lower frequency compared to the RF signal waveform.

18. The method of claim 16, wherein applying the analog gate bias waveform comprises applying the analog gate bias waveform having a rise time that is substantially shorter than a fall time.

19. The method of claim 14, further comprises generating a digital signal using a charge trap correction actuator that is converted to the analog gate bias waveform for reducing the gain error, wherein the charge trap correction actuator is configured to generate the digital signal based on an algorithm that models a charge trapping behavior and a charge detrapping behavior in the RF power semiconductor.

20. The method of claim 19, wherein the algorithm is configured to receive as an input the time-varying gain characteristic outputted by the RF power semiconductor device.

* * * * *